United States Patent [19]

Takagi et al.

[11] Patent Number: 4,539,068
[45] Date of Patent: Sep. 3, 1985

[54] VAPOR PHASE GROWTH METHOD

[75] Inventors: Mikio Takagi, Kawasaki; Kanetake Takasaki, Tokyo; Kenji Koyama, Yokosuka, all of Japan

[73] Assignee: Fujitsu Limited, Kawasaki, Japan

[21] Appl. No.: 412,260

[22] Filed: Aug. 27, 1982

Related U.S. Application Data

[63] Continuation of Ser. No. 264,805, May 18, 1981, abandoned, which is a continuation-in-part of Ser. No. 184,363, Sep. 5, 1980, abandoned.

[30] Foreign Application Priority Data

Sep. 20, 1979 [JP]   Japan ................................. 54-121489

[51] Int. Cl.³ .............................................. C30B 25/02
[52] U.S. Cl. ...................... 156/614; 427/93; 427/94; 156/DIG. 64
[58] Field of Search .............. 156/614, 613, DIG. 64, 156/DIG. 99; 423/349; 148/175; 427/34, 39, 86, 94, 93, 95, 248.1, 255.2, 87; 204/192 S, 177, 164

[56] References Cited

U.S. PATENT DOCUMENTS

| | | | |
|---|---|---|---|
| 3,472,751 | 10/1969 | King | 118/73 |
| 3,600,126 | 8/1971 | Hellund | 422/23 |
| 3,876,373 | 4/1975 | Glyptis | 422/23 |
| 4,173,661 | 11/1979 | Bourdon | 427/39 |

Primary Examiner—Hiram H. Bernstein
Attorney, Agent, or Firm—Staas & Halsey

[57] ABSTRACT

A plasma chemical vapor deposition method for forming a film on a substrate which is placed on one of a pair of electrodes oppositely arranged within the reaction chamber of a reactor. A plurality of power generators of different frequencies are applied to the electrodes to excite reactive gases introduced into the reaction chamber, whereby the reactive gases are transformed into a plasma and a desired film is formed on the substrate. Film with a small number of pinholes was formed at a relatively high deposition rate by combinations of power generator frequencies of, for example, 13.56 MHz and 1 MHz, 13.56 MHz and 50 KHz, and 5 MHz and 400 KHz.

3 Claims, 10 Drawing Figures

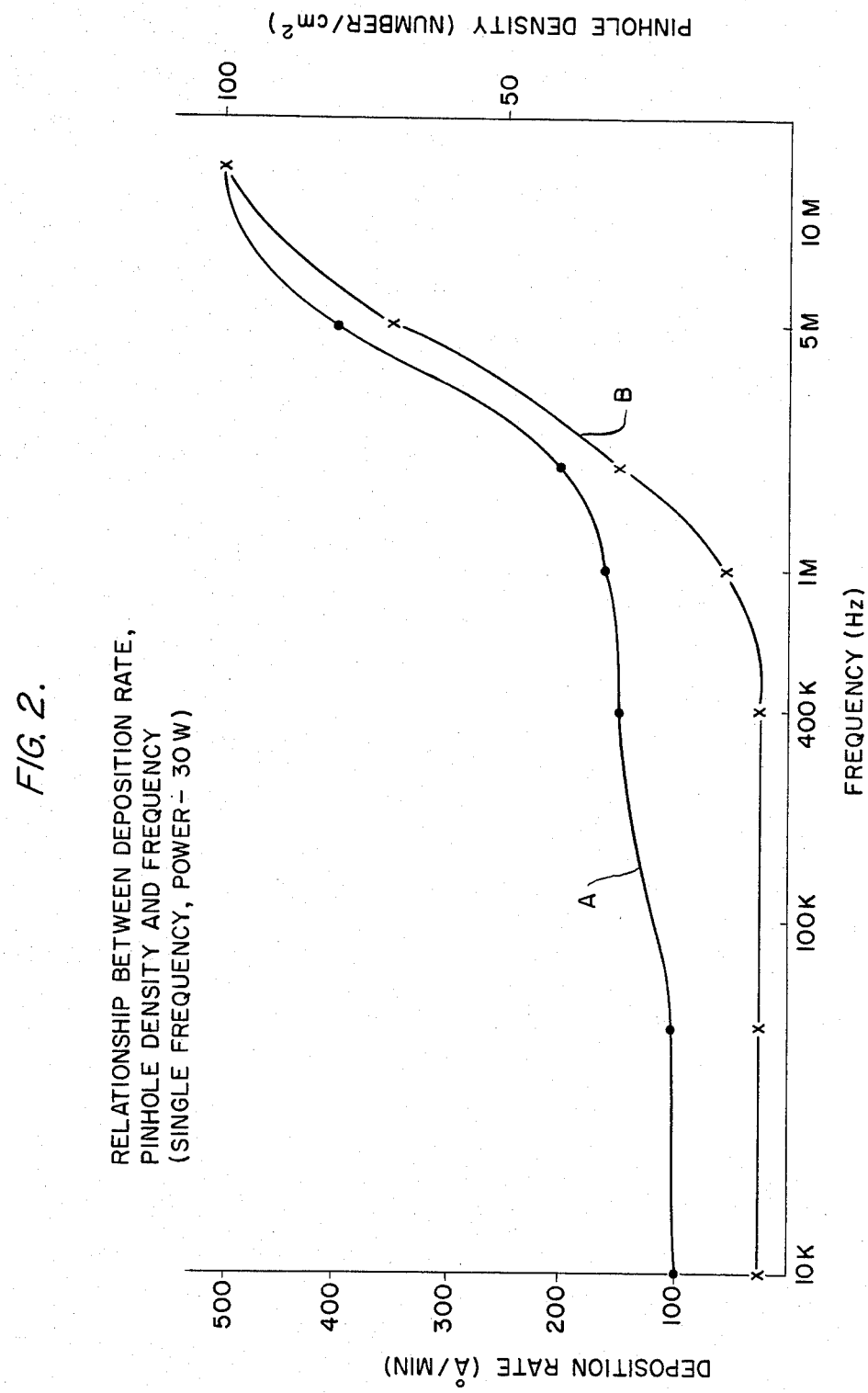

13.56 MHZ + 400 KHZ
TOTAL POWER 30W 13.56 MHZ + 1 MHZ
TOTAL POWER 30W 13.56 MHZ + 50 KHZ
TOTAL POWER 30W

5 MHZ + 400 KHZ
TOTAL POWER 30W

4,539,068

VAPOR PHASE GROWTH METHOD

CROSS-REFERENCE TO RELATED APPLICATIONS

This is a continuation of Application Ser. No. 264,805, filed May 18, 1981, now abandoned, which is a continuation-in-part of Application Ser. No. 184,363, filed Sept. 5, 1980, now abandoned.

BACKGROUND OF THE INVENTION

The present invention relates to a vapor phase growth method and apparatus, and more particularly to a plasma chemical vapor deposition (CVD) method and apparatus.

In the art to which this invention pertains, the plasma chemical vapor deposition method has been widely practiced for forming a desired film on a substrate such as a semiconductor substrate. In this method, plasma is generated between oppositely arranged elecrodes in a reaction chamber of a reactor, and a deposition is formed on the substrate by the chemical phase reaction of reactive gases introduced into the furnace tube.

One plasma CVD apparatus used to carry out the method of vapor phase growth mentioned above is schematically illustrated in cross-section in FIG. 1. This apparatus is of the so-called parallel plate type or condenser coupled type. If silicon-nitride film is to be attached or grown on the surface of a semiconductor substrate, for example, air is drawn out of a reaction chamber 1 made of quartz or stainless steel (in which case it must be shielded in the conventional manner) through an exhaust pipe 2 to maintain a vacuum pressure on the order of 1 Torr within the reaction chamber 1. The pressure will be indicated by a vacuum gauge 8. Monosilane ($SiH_4$) gas and ammonia ($NH_3$) gas are introduced through an inlet 3 into the reaction chamber via control taps or valves 10a, 10b and flow meters 9a, 9b. Radio frequency power generated by a generator 13 is applied, through a conventional matching box 14, between upper and lower electrodes 4 and 5 which are oppositely arranged to cause discharge therebetween. Matching box 14 is used to match the output impedance of the generator 13 to the input impedance of the apparatus within the reaction chamber 1. The lower part of the upper electrode 4 is a porous plate having openings. Lower electrode 5 is a two layer structure base made of aluminum covered stainless steel. The lower electrode 5 is heated, by a conventional heater 6, to 300° to 400° C. A standard thermocouple 11 is placed under the heater 6, and, through a suitable feedback controller 12, is connected to a conventional power source (not shown) for the heater 6. Semiconductor substrates 7 are placed parallel to each other on the lower electrode 5. Reactive gases are introduced into the reaction chamber 1 and are caused to jet onto the substrates 7, heated to 300° to 400° C., through openings in the porous plate of the upper electrode 4, the gases being excited by the discharge energy to effect vapor phase reaction. As a result, $Si_3N_4$ film attaches or grows on the semiconductor substrates 7.

The advantage of the above method of vapor phase growth over known ordinary chemical vapor deposition methods is that the desired film is grown on the semiconductor substrate at temperatures in the range of 300° to 400° C. compared to a temperature on the order of 850° C. employed in conventional chemical vapor deposition methods. In the manufacture of integrated circuits, it is desired to carry out the process of manufacture after the metallization process at temperatures not exceeding 450° C. because metals having low melting points are used in the interconnection of integrated circuit elements. In the method explained above, the temperature within the reaction chamber never exceeds 450° C., so that this method satisfies the temperature requirements for the manufacture of integrated circuits.

The condition of the deposition grown depends on whether the frequency used is high or low. If a low frequency is selected, a film of high quality is produced but the deposition rate is low. In contrast, if a high frequency is selected, the deposition rate is high, but the quality of the film is not satisfactory. This is a major problem encountered in carrying out the conventional vapor phase growth method in which a radio frequency power source is utilized.

As an example of the problems mentioned above, the prior art method was carried out using the apparatus shown in FIG. 1 under a variety of conditions.

For the purpose of growing a film of $Si_3N_4$ as described above, a power source frequency of 400 KHz was selected. The ratio of gases introduced was set so that $NH_3/SiH_4 = 2$. A radio frequency power in range of 10 to 30 W was used while maintaining the vacuum pressure within the reaction chamber 1 at 1 Torr. The resulting deposition rate was 150 Å/minute. Although the deposition rate was low, a high quality $Si_3N_4$ film having a small number of pinholes was grown.

Under the above conditions, the power source frequency was changed to 13.56 MHz. A high deposition rate of 500 Å/minute was achieved, but there were many pinholes, hence poor film quality.

The experimental results obtained by carrying out the plasma chemical vapor deposition method by applying a single radio frequency power source, including the two examples described above, are shown graphically in FIG. 2 which shows the relationship between the frequency and the deposition rate and pinhole density. The applied power was 30 W, or the power density per unit area of the electrode was 0.3 W/cm$^2$. In FIG. 2, the abscissa represents the power frequency and the ordinates the deposition rate at left and the pinhole density at right. In FIG. 2, curve A illustrates the relationship between the power frequency and the deposition rate and curve B illustrates the relationship between the power frequency and the pinhole density.

This phenomenon is due to the high rate of growth of silicon ions and nitrogen ions or silicon radicals and nitrogen radicals which bring about not only the growth of $Si_3N_4$ on the surface of semiconductor substrate but also the falling down and deposition of $Si_3N_4$ produced through reaction in the vapor phase.

Further, if high frequency power is applied, the thermocouple 11 beneath the lower electrode 5 functions as an antenna, and thus produces noises that affect the feedback controller 12 which is liable to cause unwanted temperature rise. On the other hand, plasma generated by low frequency power is unstable. Therefore, whether high frequency or low frequency power is used, there are both advantages and disadvantages.

SUMMARY OF THE INVENTION

It is therefore an object of this invention to offer a solution to the technical problem encountered in the prior art by providing a novel method of growing a superior quality film at an efficient rate of deposition.

In order to achieve this object, a plasma chemical vapor deposition method for forming a film on a substrate comprises the steps of: disposing a substrate in a reaction chamber, introducing reactive gases into the reaction chamber, applying electric power from a plurality of different frequeny power generators to excite the reactive gases which are transformed into plasma, thereby forming a desired film on the substrate.

This together with other objects and advantages, which will become subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 2 is a graph illustrating the relationship between the radio frequency power source frequency (Hz) and the deposition rate and pinhole density (expresed in terms of the number of pinholes per unit area);

DETAILED DESCRIPTION OF THE PREFERRED EMBODIMENT

Figure 1:
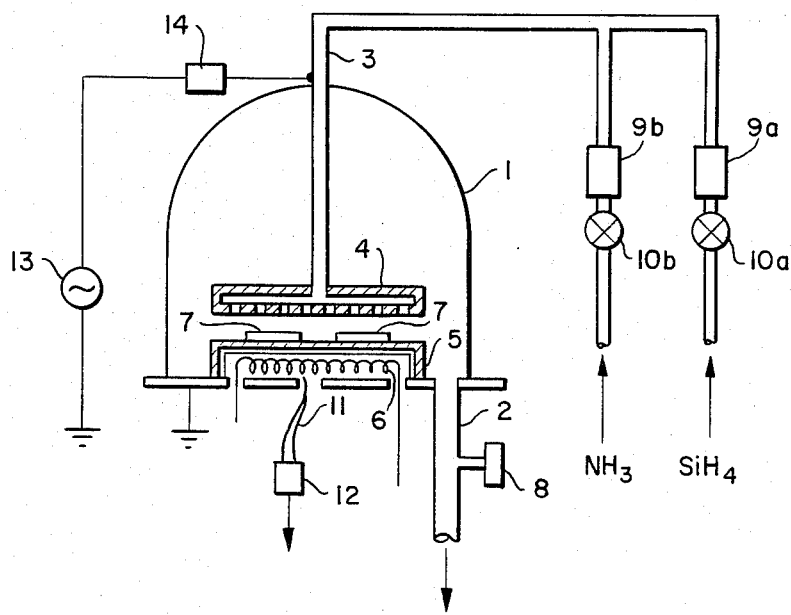
FIG. 1 is a schematic cross-sectional view illustrating an apparatus for carrying out a prior art plasma chemical vapor deposition method.

In the present invention, electric power is applied simultaneously from a high frequency power source and a low frequency power source in order to overcome the technical problems described above. The apparatus for carrying out the method of the present invention is schematically shown in FIG. 3 in cross-section.

A generator 13 generates 5 W of power (or a power density of 0.05 W per unit area of the electrode) at 13.56 MHz which is applied to upper and lower electrodes 4 and 5 through a matching box 14 and a conventional high-pass filter 15 which cuts off frequencies lower than 5 MHz. Likewise, a generator 113 generates 25 W of power (or a power density of 0.25 W per unit area of the electrode) at 400 KHz which is similarly applied to upper and lower electrodes 4 and 5 through a conventional matching box 114 and a conventional low-pass filter 115 which cuts off frequencies higher than 1 MHz. Thus, two frequencies are superimposed or mixed to generate 30 W of power to cause electric discharge.

Figure 3:
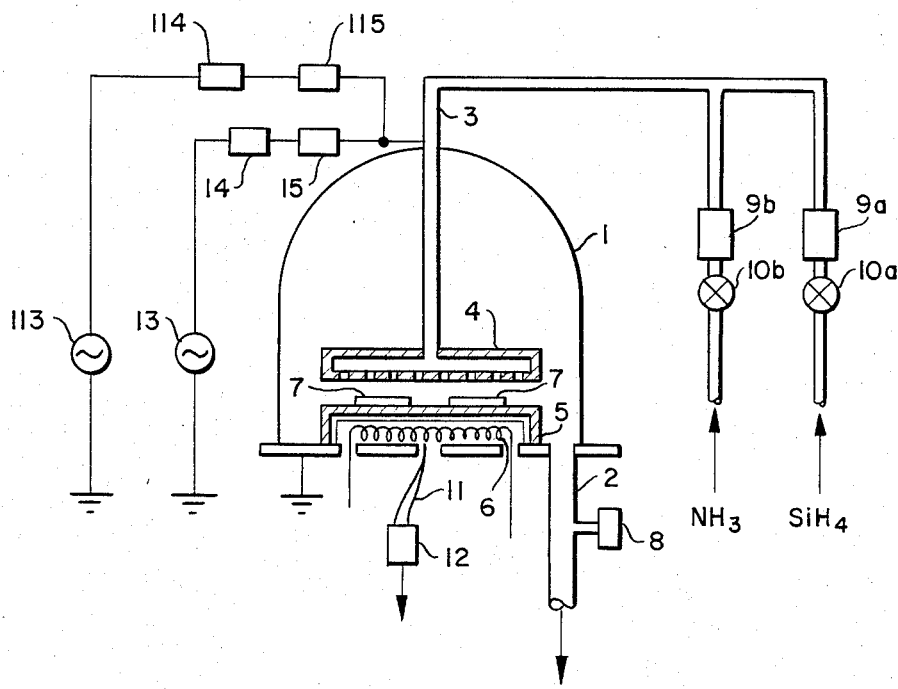
FIG. 3 is a schematic cross-sectional view illustrating an apparatus for carrying out the plasma chemical vapor deposition method of the present invention.

When the diameter of the openings of the electrode 4 exceeds a certain value within the pressure range (0.1 to 2 Torr) of the reaction gas $SiH_4+NH_3$ used for the reaction in the embodiment of the present invention using the vapor growth apparatus shown in FIG. 3, an arc discharge is generated in the direction of the electrode 5 at the edge of the openings. Therefore, the reaction gas will partially react in the vicinity of the opening and the substances generated by this reaction will fall on the semiconductor substrate 7. These substances have a large grainsize and low adherence to the semiconductor substrate 7. For this reason, when these substances are mixed with the substances generated by the reaction in the vicinity of the surface of the semiconductor substrate 7, namely with the silicon nitride generated by the normal vapor phase reaction, the overall film quality of the silicon nitride film is degraded. Therefore, generation of this arc discharge is not desirable. This arc discharge is generated when each opening occupies a large area of the electrode 4, because the electric field distribution at the surface facing the electrode 5 becomes unequal and the electric fields are concentrated at the edge of each opening. The inventors of the present invention have found the arc discharge is not generated when the diameter of the openings provided on the electrode 4 is 500 μm or less.

Figure 10:
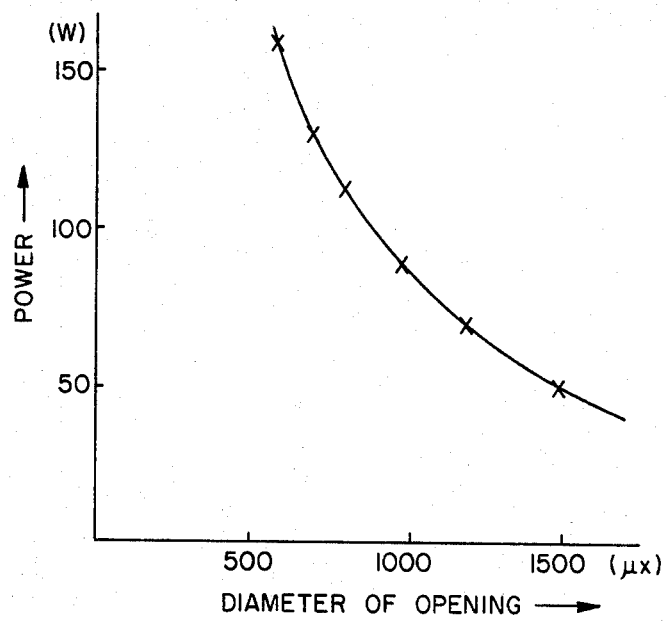
FIG. 10 is a graph illustrating the relationship between the diameter of the openings provided in the electrode 4 and the arc discharge starting power.

FIG. 10 is a graph illustrating the relationship between the diameter of the above-mentioned openings and the arc discharge starting power. As is clear from FIG. 10, when the diameter of the openings is 500 μm or less, the arc discharge is not generated. On the other hand, it is difficult to obtain an opening diameter of 200 μm or less due to the difficulties presented in machining such a small opening. Thus, in the present invention, the diameter of the openings provided on the electrode 4 is selected to be within the range of from 200 to 500 μm. The openings are arranged in the form of a matrix on the surface of the electrode 4 facing the electrode 5, with a spacing of 3 mm. In addition, when the reaction gas $SiH_4+N_2$ (instead of $SiH_4+NH_3$) is used as the reaction gas for generating the silicon nitride film, generation of the arc discharge is more efficiently suppressed. In this case, the arc discharge can also be suppressed to a certain extent when argon (Ar) gas is used as the carrier gas.

By applying the radio frequency power as described above, the film obtained has only the advantages (and none of the disadvantages) found when using the two frequencies alone.

Figure 4:
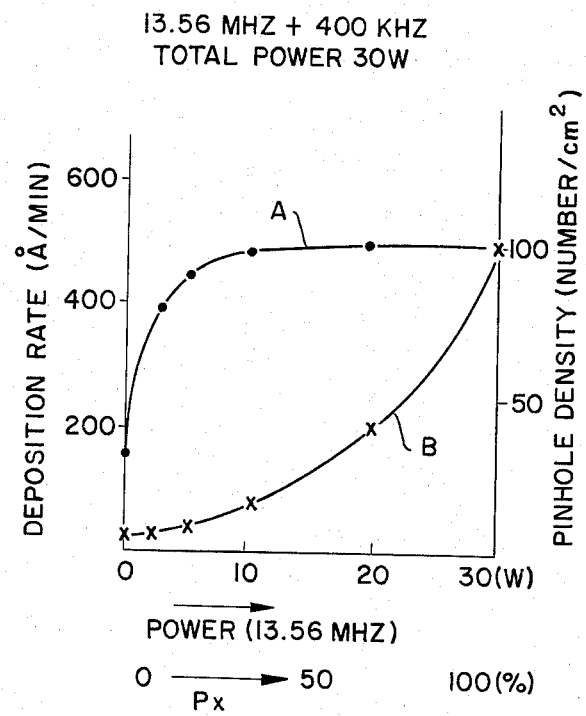
FIG. 4 is a graphic illustration of the relationship between the applied electric power and the deposition rate and pinhole density (expressed by the number of pinholes per unit area) for the preferred embodiment of the present invention.

FIG. 4 is a graph illustrating the relationship between the electric power (at 13.56 MHz), the power ratio Px of the two frequencies, and the deposition rate (Å/minute) and pinhole density (number of pinholes/cm²) in growing a film of $Si_3N_4$, in the manner described above, using the apparatus of FIG. 3. In FIG. 4, curve A illustrates the relationship between the power (or power ratio) and deposition rate and curve B illustrates the relationship between the power (or power ratio) and pinhole density. The abscissa power ratio Px is expressed by $$Px = \frac{\text{power at 13.56 MHz frequency}}{(\text{power at 13.56 MHz frequency}) + \text{power at 400 KHz frequency}} \times 100\, (\%)$$

The total power was maintained at a constant value of 30 W, or power density of 0.3 W/cm² as described above.

As will be understood from an examination of the graph of FIG. 4, a relatively high deposition rate of 400 Å/minute is obtained with a relatively small pinhole density of 7/cm² to 15/cm² when the electric power at 13.56 MHz is approximately 2.5 to 10 W, (a power density of $0.025/cm^2$ to $0.1/cm^2$) and that at 400 KHz is approximately 27.5 to 20 W (a power density of 0.275 $W/cm^2$ to 0.2 $W/cm^2$). In this situation, the power ratio Px is approximately 8.3 to 33.3%. Further embodiments of the invention will be described hereinafter.

Figure 5:
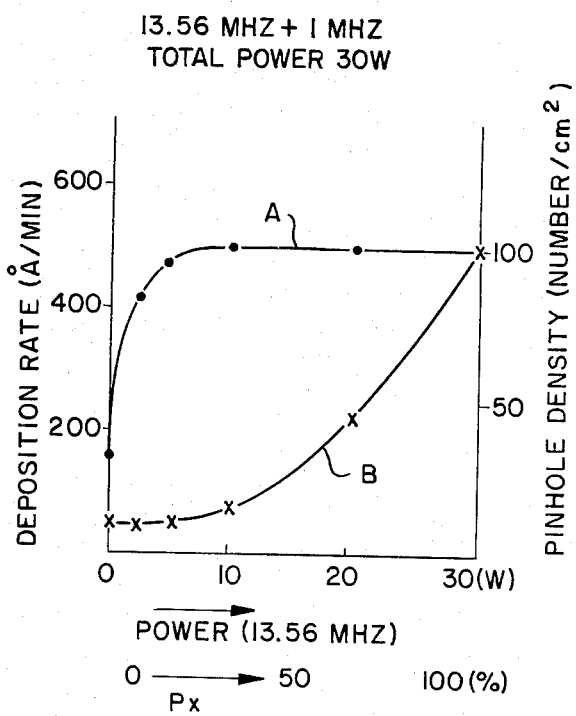
FIGS. 5, 6 and 7 are graphic illustrations similar to that of FIG. 4 for alternative embodiments of the present invention.
Figure 6:
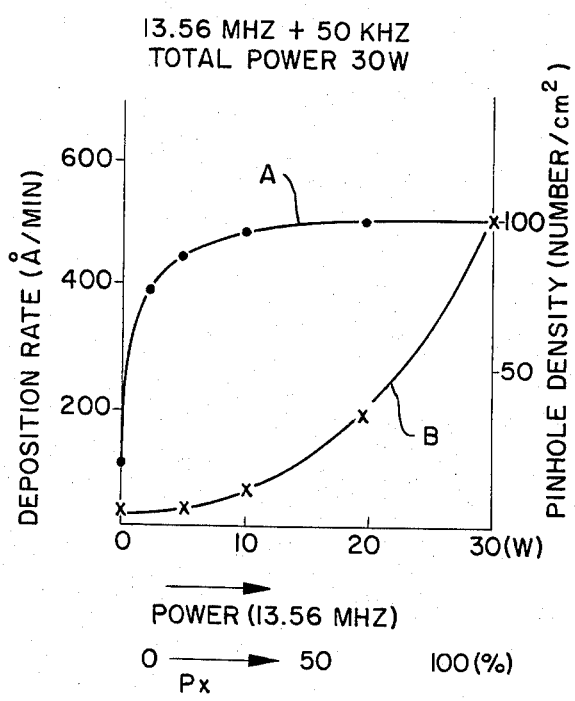
Figure 7:
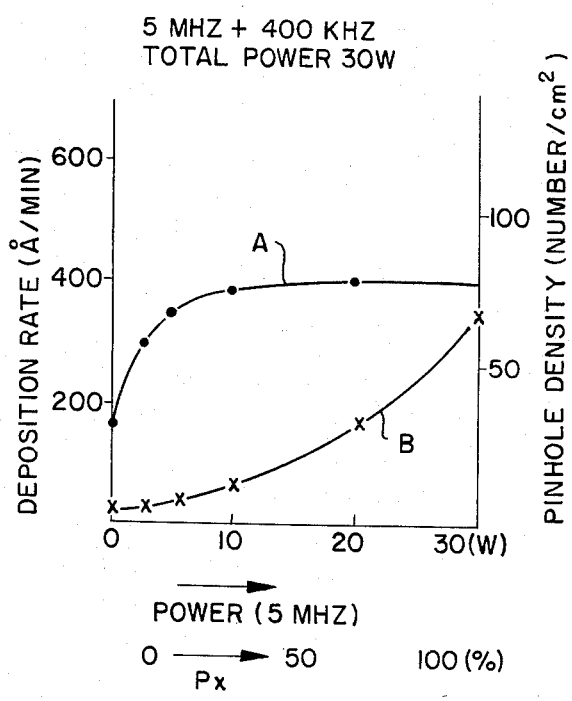

Three embodiments of the present invention are graphically depicted in FIGS. 5, 6 and 7. In all cases, a total power of 30 W (a power density per unit area of electrode is 0.3 $W/cm^2$) is applied. In each of FIGS. 5, 6 and 7, the ordinates represent the deposition rate at left and the pinhole density (the number of pinholes per unit area of film grown) at right. In FIG. 5, curve A illustrates the relationship between the power (or power ratio) and deposition rate and curve B illustrates the relationship between the power (or power ratio) and pinhole density. The abscissa represents the power as follows:

in FIG. 5, the power and the power ratio from the 13.56 MHz generator;

in FIG. 6, the power and the power ratio from the 13.56 MHz generator; and in FIG. 7, the power and the power ratio from the 5 MHz generator.

The value of the power and the power ratio from the other frequency power source is obtained in each case by subtracting the values represented on the abscissa from 30 W and 100%, respectively.

Good results, namely a film with a small number of pinholes at a relatively high deposition rate, are obtained in each of these embodiments when the power from the high frequency generator is on the order of 2.5 to 10 W (corresponding to a power density on the order of 0.025 to 0.1 W per unit area of the electrode and a power ratio on the order of 8.3 to 33.3%).

Figure 8:
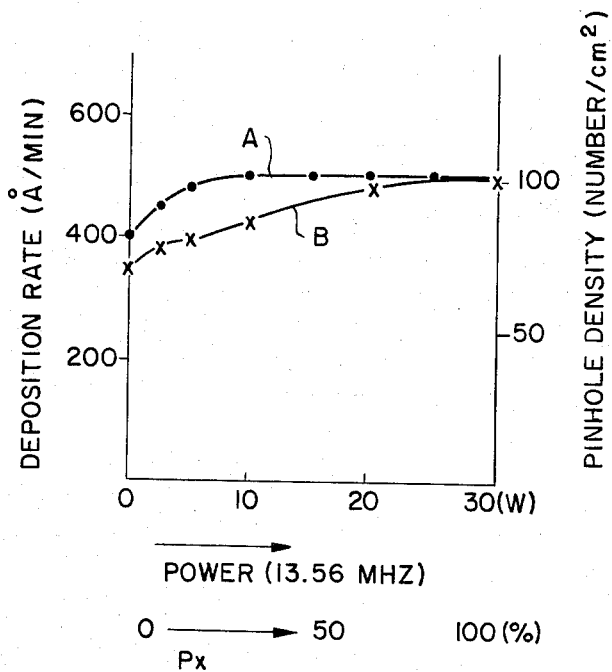
FIGS. 8 and 9 are graphic illustrations, similar to that of FIG. 4, which illustrate two examples of deposition methods providing unsatisfactory results.
Figure 9:
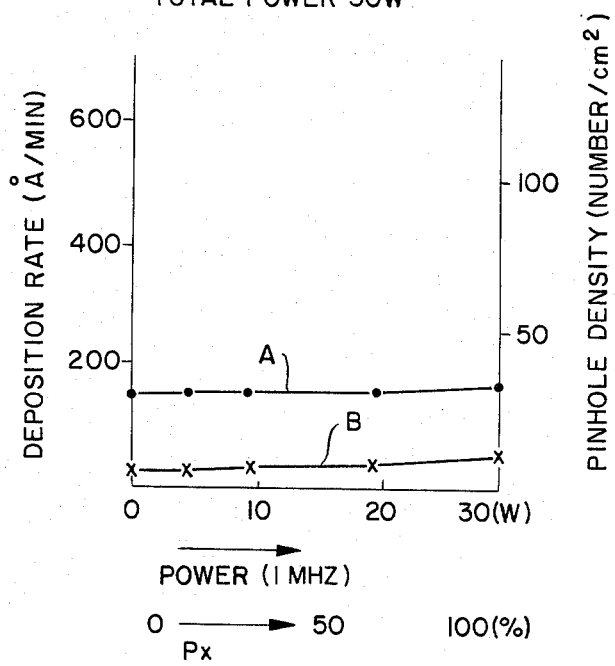

In contrast to the above-described embodiments, two examples illustrated in FIGS. 8 and 9 show the limitations of the deposition rate and pinhole density.

FIG. 8 illustrates a situation in which (a power density of 0.3 W per unit area of the electrode) is applied from a 13.56 MHz power source and a 5 MHz power source. As is apparent from the graph, high deposition rates (curve A) are prevalent but pinhole densities (curve B) are high.

FIG. 9 illustrates a situation in which a total power of 30 W (or power density of 0.3 W per unit area of the electrode), is applied from a 1 MHz power source and a 400 KHz power source. The results indicate that pinhole densities (curve B) are low, but deposition rates (curve A) are almost constantly low.

The results of mixing power sources of two different frequencies are enumerated below:

(1) Pinhole density is high (70 pinholes per unit area of film grown) when power sources having frequencies higher than 5 MHz are mixed.

(2) Deposition rate is not improved (less than 200 Å/minute) if power sources having frequencies lower than 1 MHz are mixed.

(3) If a 5 MHz frequency power source and a power source having a frequency lower than 1 MHz are mixed, the result is the same as when a 13.56 MHz power source and a 1 MHz power source are mixed.

(4) In order to decrease the pinhole density (less than 15 pinholes per unit area of film grown), the lower frequency power source must be maintained less than or equal to 1 MHz.

(5) In order to increase the deposition rate (300 Å/minute or more), the higher frequency power source must be maintained greater than or equal to 5 MHz.

As will be understood from the foregoing description of embodiment concerning the $Si_3N_4$ film, chemical vapor deposition film of good quality is grown without impairing the yield by properly selecting the ratio of high frequency and low frequency power sources.

Therefore, CVD film of good quality can be grown at a low cost according to the method of the present invention. It is apparent that the invention contributes substantially not only in the manufacture of electronic components such as semiconductor chips, but also in the development of the electronic industry.

It should be noted that, although the above embodiments concern a method of forming $Si_3N_4$ films, the method of the present invention is not limited thereto and may be used to grow films of silicon dioxide ($SiO_2$), amorphous silicon, and phosphosilicate glass. Furthermore, although the above embodiment was explained with reference to the condenser coupled type plasma CVD apparatus, the method of the present invention is not limited thereto and it is applicable to the well known inductive coupling type plasma CVD apparatus.

The many features and advantages of the invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed is:

1. A method of plasma chemical vapor deposition for forming a film on a substrate, comprising the steps of:
    disposing the substrate in a reaction chamber having a pair of electrodes;
    introducing reactive gases into the reaction chamber; and
    simultaneously applying a plurality of electric power sources of different frequencies to the pair of electrodes to excite the reactive gases which are transformed into a plasma, the plurality of electric power sources of different frequencies including a first electric power source having a first frequency and a second electric power source having a second frequency, the first frequency providing a high deposition rate relative to the second frequency, the second frequency producing a reduced number of pinholes in the film relative to the first frequency; and
    depositing the film, having the reduced number of pinholes, on the substrate from the plasma generated by simultaneously applying the plurality of electric sources of different frequencies.

2. The method as set forth in claim 1, wherein the first electric power source comprises a high frequency power source having a frequency higher than 5 MHz and wherein the second electric power source comprises a low frequency power source having a frequency below 1 MHz.

3. The method as set forth in claim 2, wherein the electric power applying step comprises mixing the outputs of the plurality of electric power sources and applying the mixed power to the pair of electrodes, the power ratio of the high frequency power source to the total power applied being on the order of 8.3 to 33.3%.

* * * * *